United States Patent [19]

Gentile et al.

[11] 3,933,990

[45] Jan. 20, 1976

[54] SYNTHESIZATION METHOD OF TERNARY CHALCOGENIDES

[75] Inventors: Anthony L. Gentile, Thousand Oaks; Oscar M. Stafsudd, Los Angeles, both of Calif.

[73] Assignee: Hughes Aircraft Company, Culver City, Calif.

[22] Filed: Aug. 11, 1969

[21] Appl. No.: 849,001

[52] U.S. Cl. ................ 423/508; 148/1.6; 423/511; 23/295
[51] Int. Cl.² ... C01B 19/00; C01B 17/00; B01J 17/08
[58] Field of Search ............... 23/315, 204, 52, 301; 148/1.6; 423/508, 511

[56] References Cited
UNITED STATES PATENTS

| | | | |
|---|---|---|---|
| 3,008,797 | 11/1961 | Bither | 23/315 |
| 3,154,384 | 10/1964 | Jones | 148/1.6 |
| 3,366,454 | 1/1968 | Folberth et al. | 23/204 |
| 3,397,043 | 8/1968 | Spitzer | 23/315 |
| 3,449,087 | 1/1969 | Saylor | 23/301 X |
| 3,480,409 | 11/1969 | Dillon, Jr. et al. | 423/508 |
| 3,519,402 | 7/1970 | Holliger | 423/508 |
| 3,537,912 | 11/1970 | Aven et al. | 148/1.6 |
| 3,773,909 | 11/1973 | Pearlman et al. | 423/508 |

OTHER PUBLICATIONS

Bardsley et al., "Journal Of Crystal Growth," Vols. 3, 4, pp. 268–271 (1968).
Willardson et al., "Compound Semiconductors," 1962, pp. 85–87.
Zhuze, V. P. et al.; "Soviet Physics" Vol. 3, No. 10; Oct. 1958.

*Primary Examiner*—John H. Mack
*Assistant Examiner*—Aaron Weisstuch
*Attorney, Agent, or Firm*—James K. Haskell; W. H. MacAllister; Lewis B. Sternfels

[57] ABSTRACT

Large, strain free, single crystals of high optical quality selected from the IB-VB-VIB and IIIB-VB-VIB ternary chalcogenide groups, having a single stable solid phase from room temperature to the melting point of the crystal and vice-versa, are synthesized by (1) placing stoichiometric quantities of the compound constituents with 3% excess VIB constituent in a two part, sublimation-reaction fused silica tube, the VB constituents being placed in sublimation part, and the remaining constituents being placed in the reaction part, and evacuating and sealing the tube, (2) subliming and purifying the VB constituent and condensing it in the reaction part, which is then cooled and sealed from the sublimation part, (3) reacting, uniting and slowly cooling the reaction part constituents, (4) placing the reacted constituents in fused silica growth tube, which is evacuated, backfilled with helium, and sealed, (5) forming a melt in the upper part of a two part furnace and lowering at about 1.8 mm/hr. through a greater than 100°C temperature gradient, (6) annealing the single crystal in the lower furnace part about one-half the melting point temperature and cooling it to room temperature at about 5°C/hr., and (7) removing the crystal by dissolving the tube in hydrofluoric acid.

25 Claims, 4 Drawing Figures

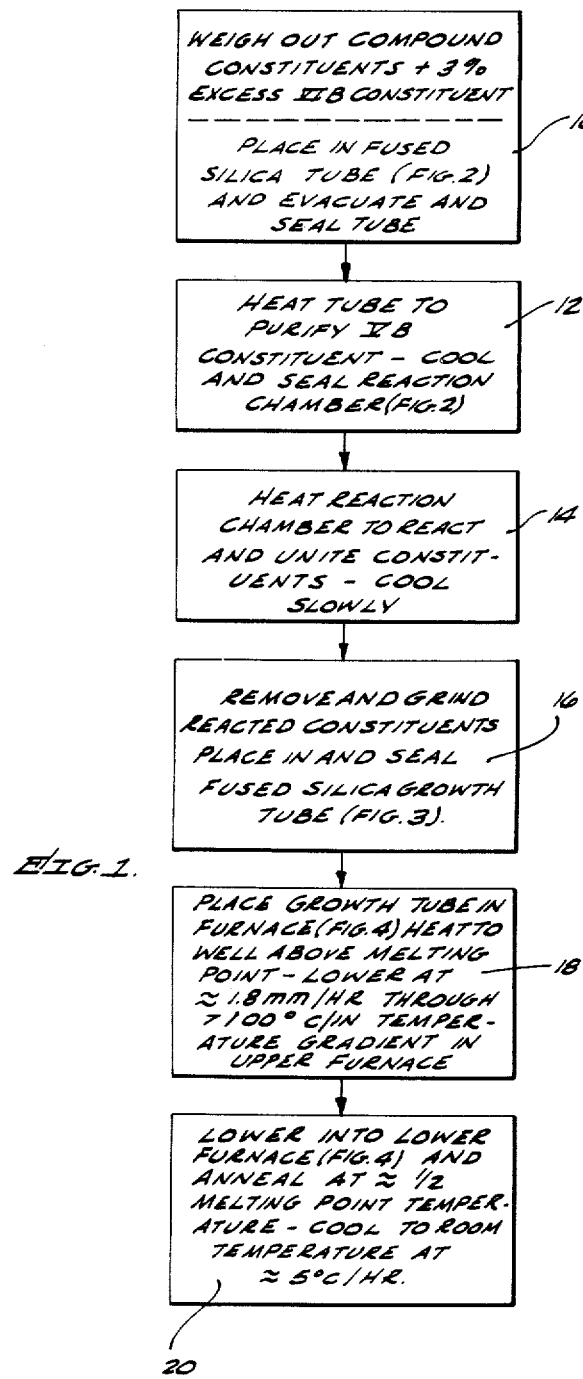

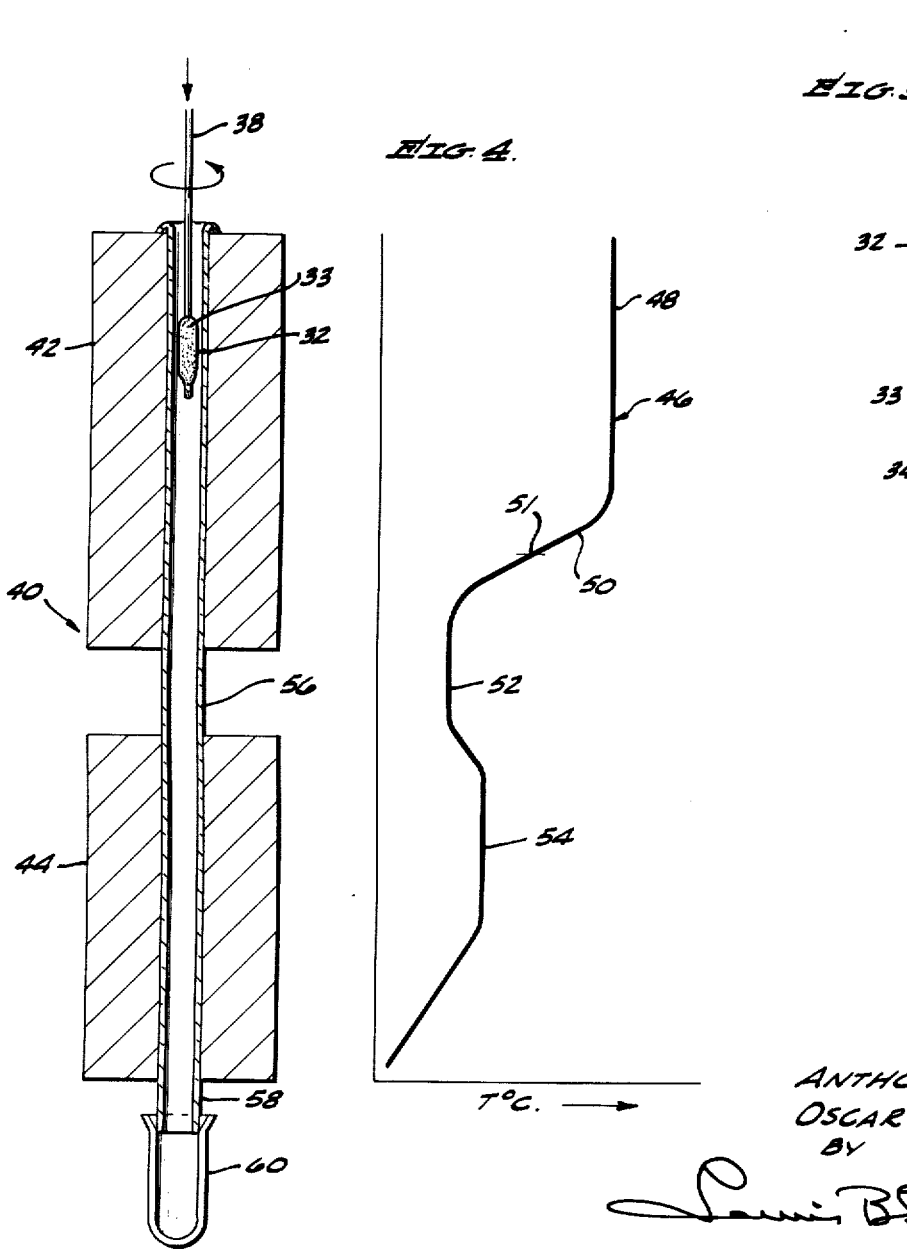

SYNTHESIZATION METHOD OF TERNARY CHALCOGENIDES

The present invention relates to a method for the preparation of single crystals of ternary chalcogenides selected from the IB-VB-VIB and IIIB-VB-VIB Groups of the Periodic Table of Elements in accordance with the periodic classifications of Glasstone "The Elements of Physical Chemistry", page 19, D. Van Nostrand Company, Inc., 1946, and of Moeller "Inorganic Chemistry", pages 122, 125, 126, John Wiley & Sons, Inc., 1952, having a single stable solid phase from room temperature to the melting point of the crystals and vice-versa.

Ternary chalcogenides, such as proustite, pyrargyrite, and billingsleyite, have been used as non-linear materials, that is, they have an ability to produce such optical effects as adding or subtracting electromagnetic waves (e.g., frequency doubling), optical heterodyning, and electro-optical modulation. Such ternary chalcogenides may be used in laser devices to obtain a frequency which is different from the frequency applied and as large band gap semiconductors, parametric devices, and infrared detectors.

Ternary chalcogenides found in nature or synthesized by prior art methods are not available as large single crystals having a desired sufficiently high optical quality without strain or strain cracking. In fact, with the exception of proustite and pyrargyrite, the materials encompassed by the present invention have not been previously synthesized as single crystals. The unavailability of high quality crystals is traceable primarily to the presence in the crystal of such anion impurities as oxygen, water vapor, and silicon dioxide. The presence of oxygen is particularly troublesome because the elements of the VB Group of the Periodic Table have a great affinity for combining with oxygen and such anion impurity is not easily removable from the VB element and it cannot be practically removed from the ternary chalcogenide material once preparation thereof has been completed. Another problem exists in the difficulty of synthesizing ternary chalcogenides because they tend to supercool, i.e., they cool below their melting point but remain as a liquid before suddenly freezing out dendritically, thus resulting in a polycrystalline product. Furthermore, the control of the physical distribution of the constituent materials of the ternary chalcogenides is not easily obtainable.

The present invention overcomes these and other problems by providing a method for synthesizing high optical quality, strain free, single crystals of certain ternary chalcogenides. The first step of this method comprises the weighing out of the compound constituents in stoichiometric proportions with an additional 3% beyond stoichiometric amounts of the VIB constituent. The additional VIB element, in particular, sulfur, ensures that a high yield of suitable crystal material can be obtained during the crystal growing step and the use of the excess VIB element is apparently attributable to the fact that the crystal shows pressure sensitive retrograde solubility, that is, during crystal growth, a sulfur overpressure keeps the sulfur in the crystal; otherwise, the sulfur in the crystal would move out of the crystal as the temperature later is lowered, the sulfur forming a vapor and condensate. However, before mixing the constituents, the VB element must first be purified of oxygen and water vapor, and, likewise, the silicon dioxide (fused silica ware) must also be purified, which are important steps of the inventive method. Thereafter, the mixing of all the constituents must occur without permitting any recombination of these anion impurities with the VB element.

To effect these purification and mixing steps, a special sublimation-reaction tube of fused silica is utilized. This tube is sufficiently elongated so that the VB constituent can be placed in one end thereof, which is used as a sublimation chamber, and the remaining constituents, including an additional 3% excess of the VIB constituent, can be placed in the other end of the tube, which acts as a condensation-reaction chamber. Since the two steps of purification and mixture of the constituents takes place in the same tube and since the constituents are in a solid form, care must be taken to prevent premature mixture of the constituents prior to purification and to avoid subsequent mixture of the impurities once the constituents are mixed. Therefore, the tube is specially configured so that the sublimation chamber is connected to the condensation-reaction chamber by means of a connecting neck having a small opening therein. This neck is smaller in diameter than that of the chambers and is only so large as to permit passage through the opening of only the vapor formed from the VB element. It is also preferred to utilize a granular material rather than powder for the remaining IB or IIIB and VIB constituents to further prevent mechanical transport of any of the constituents, whether contaminated or not. Finally, the neck facilitates the sealing off, during a later step, of the reaction chamber from the residue and impurities in the sublimation chamber.

The sublimation chamber with its contained constituents is placed in a furnace while at least a major part of the reaction chamber with the remaining constituents therein is positioned outside of the furnace to maintain the reaction chamber cooler than the sublimation chamber and to prevent the build up of vapor pressure from the VIB element which otherwise would force the VB element back into the sublimation chamber by the process of back diffusion. The furnace must be able to produce sufficient heat in order to vaporize the VB element at a uniform temperature. A clamshell furnace is suitable for this purpose. The sublimation chamber with its contained VB elements is than heated sufficiently to form a vapor from the VB element, which is then transported through the neck to and condenses in the reaction tube, in accordance with the Second Law of Thermodynamics. The sublimated VB element leaves behind residue which is identifiable as suboxides of the sublimed element. After the pure VB element has been driven into the reaction chamber, the furnace is cooled at any convenient rate and the tube is removed and sealed off at the neck. The diffusion tube is discarded. Sealing may be performed by conventional glass blowing methods, such as by use of a blow torch.

The sealed reaction tube is then heated uniformly in a furnace having the ability to produce heat at isothermal temperature conditions sufficient to cause proper uniting of the crystal constituents, the ranges of temperatures being relatively critical in order to provide for the proper uniting of the materials and yet to prevent excessive build-up of explosive pressures in the reaction tube. The reaction tube and the materials are then left to react in the furnace at the reaction temperature for approximately one-half to one hour to insure proper uniting of the materials. Thereafter, the furnace is shut off and the tube is cooled at a uniform rate to room temperature, for approximately 2–3 hours, to provide for uniformity of the distribution of the constituents throughout the formed chalcogenide crystal material. This reacted material is then removed from the reaction chamber in any convenient manner such as by cracking the tube which is discarded.

For VB elements having a low vapor pressure, for example, antimony, the metal is purified first by baking it above its melting point in a stream of hydrogen and thereafter is removed and placed into the reaction tube.

The reacted material or charge material, which generally is in polycrystalline form, is then ground and placed in a fused silica crystal growth tube having an elongated neck which is used to obtain nucleation of a single crystal. Excess of the VIB constituent is also transferred with the charge material. As an alternative method, the reaction tube may be formed in the shape of a growth tube, thereby eliminating the above-mentioned destruction of the reaction tube. In the first case, the growth tube, after having been filled with material is evacuated to approximately $10^{-6}$ Torr and then back filled with pure helium at a pressure of about 250 Torr. The growth tube is sealed and attached to a long rod for placement in a crystal growth furnace.

This crystal growth furnace is constructed in two parts having a separation therebetween, the upper part being utilized for growth of a single crystal from the charge material and the second part for annealing of the single crystal. The distance between the upper part and the lower part is established by maintaining a constant temperature, for example, of approximately 100°C, throughout the connecting zone. The upper furnace part has a temperature profile comprising an isothermal portion and a steep decreasing temperature gradient. The temperature at the isothermal portion is as high as can be possibly made and extends into the temperature at which the charge material reacts but is below the decomposition temperature thereof. The reason for this high temperature of the isothermal portion is to most easily obtain the steep decreasing temperature gradient which, for example, is at least 100°C per inch (approximately 4°C per mm) and preferably at 150°C per inch (approximately 6°C per mm). The lowering rate of the crystal growth tube ranges from 1.5 mm to 2.0 mm per hour to assure, in conjunction with the high temperature and steep decreasing temperature gradient, slow growth conditions in the tube before the solid-liquid interface of the forming single crystal leaves the narrow region in the elongated nucleation neck of the tube.

For growth of the single crystal, the charge material from the reaction step, when placed in the growth tube, is suspended in the isothermal temperature portion for a period of time sufficient to thoroughly form a homogeneous melt. The tube may also be rotated at approximately 1.5 rpm to enhance radial distribution and uniform temperatures of the melt. Lowering then commences through the decreasing temperature gradient until a single crystal is formed. Lowering of the tube and single crystal continues into the second furnace part where the lowering is stopped. The single crystal is annealed in this lower furnace part and the furnace temperature is slowly lowered at 2.5°–5.0°C per hour and preferably at 5°C per hour to room temperature.

The single crystal is then removed from the growth tube without the use of any mechanical pressure and, for this purpose, the fused silica growth tube preferably is dissolved in hydrofluoric acid.

It is, therefore, an object of the present invention to provide a novel means for synthesizing single crystal ternary chalcogenide compounds of the IB-VB-VIB and IIIB-VB-VIB Groups of the Periodic Table having a single stable solid phase from room temperature to the melting point of the crystal and vice-versa.

Another object of the invention is the provision of such single crystals having high optical quality.

Another object is to provide such crystal without strain or strain cracking.

Another object is the provision of such a crystal devoid of anion impurities.

Other aims and objects, as well as a more complete understanding of the present invention, will appear from the following explanation of exemplary embodiments and the accompanying drawings thereof, in which:

FIG. 1 is a flow diagram describing the several steps used to synthesize the single crystals herein disclosed;

FIG. 2 is a schematic diagram of the furnace and tube utilized to purify the VB component of the single crystal and to mix this constituent with the remaining constituents of the single crystal in order to obtain reaction thereof;

FIG. 3 depicts the crystal growth tube utilized to form the single crystal; and

FIG. 4 is a schematic diagram of the two part crystal growth and annealing furnace for preparation of the single crystal wherein the temperature profile of the furnace is shown alongside thereof.

The flow diagram of FIG. 1 is used to outline the succession of the several method steps accomplished by use of the apparatus depicted in FIGS. 2–4 wherein the apparatus of FIG. 2 carries out the steps outlined in enclosures 10 and 12 of FIG. 1, a furnace having an isothermal temperature is utilized for the step outlined in enclosure 14, the tube of FIG. 3 is utilized for the step outlined in enclosure 16, and the apparatus depicted in FIG. 4 is utilized for the steps outlined in enclosures 18 and 20.

In FIG. 2, a tube 22 is divided into a pair of chambers comprising a sublimation chamber 24 and a reaction chamber 26 which are joined by a neck portion 27 having an opening 28 of internal diameter of 1–2 millimeters. The diameter of the neck opening is used to maintain a separation between the single crystal constituents 30 and 31 which are to be respectively placed in chambers 24 and 26 and also to facilitate the sealing off of reaction chamber 26 from chamber 24 after sublimation has taken place. The materials placed in the chambers are also preferably in granular form rather than a powder in order to further prevent mechanical transport of the solid materials from one chamber into the other chamber. However, it is possible to utilize a tube without neck portion 27 and to utilize a fine powder if very great care in the handling of the tube is taken. It is obvious, therefore, that the use of neck 27 and granular material is preferred.

Sublimation chamber 24 is disposed to be placed within a furnace 29, such as a clamshell furnace, which can provide a uniform temperature.

In operation, the IB or IIIB constituents, depending upon the particular crystal to be synthesized, and the VIB constituent (all designated by indicia 30) are placed in reaction chamber 26 and the VB constituent 31 is placed in sublimation chamber 24. Stoichiometric proportions of these constituents are measured out. An additional 3% quantity beyond stoichiometric amounts of the VIB constituent is placed in reaction chamber 26. Tube 22 is then evacuated to approximately $10^{-6}$ Torr and sealed. Sublimation chamber and its contained constituent 31 are placed within furnace 29 with the major portion of chamber 26 left on the furnace exterior, and the temperature is raised to an amount sufficient to obtain vaporization of the constituent in the sublimation chamber.

Placement of reaction chamber 26 exterior to furnace 29 permits it to be maintained at a temperature which is cooler than that of the sublimation chamber so that the VB constituent as a vapor will be transported over to the reaction chamber and condensed therein according to the Second Law of Thermodynamics. In addition, by maintaining the reaction chamber relatively cool with respect to sublimation chamber 24, build up of pressure from the VIB constituent is avoided which pressure would otherwise force the VB constituent vapor back into sublimation chamber 24 by a process of back diffusion where undesired subsequent reaction would occur. The majority of the VB constituent is thus transported over into the reaction chamber, the remainder being identified as suboxides of the VB element and possibly some VB and VIB compounds. Furnace 29 is cooled and tube 22 is removed therefrom. Neck 27 is then closed by conventional glass forming processes in order to seal reaction chamber 26 and to separate sublimation chamber 24 therefrom.

In the following step, the reaction tube is uniformly heated to a temperature sufficient to cause proper uniting of the single crystal materials within a period of time from one half hour to one hour. The furnace utilized for this reaction step must provide uniform temperature conditions and, for this purpose, a clamshell furnace is suitable. The reaction temperature must be held within fairly strict limits, the lower temperature being the lowest temperature at which reaction occurs and the upper temperature being the temperature below which the pressure within tube 26 would become so great as to rupture the tube. For proustite ($Ag_3AsS_3$) and pyrargyrite ($Ag_3SbS_3$) for example, the reaction temperatures are between 700° and 800°C. For silver arsenic selenide ($AgAsSe_2$) and silver antimony selenide ($AgSbSe_2$) the reaction temperatures range between 600° and 650°C, for silver arsenic selenide ($Ag_7AsSe_6$) the range is between 500° and 550°C, and for thallium arsenic sulfide ($Tl_3AsS_3$) the temperature range is between 400° and 450°C.

After reaction has been accomplished, the furnace is shut off and allowed to cool uniformly to room temperature, the cooling occurring within 2 or 3 hours, in order to insure uniformity of distribution of the constituents of the charge. Such uniformity is required if the material is to be ground for further processing; however, if grinding is not undertaken, i.e., if the entire charge is to be used in one crystal growth tube, the reaction tube and its reacted charge material can be quenched.

The material from reaction tube 26 is generally in a polycrystalline form and is removed by cracking the tube and, after the material is ground into suitable sizes, it is placed in a growth tube 32 of fused silica, depicted in FIG. 3, and is shown as a charge material 33. Any excess VIB constituent which has remained from prior operations, is transferred with this charge material. Tube 32 is provided with an elongated nucleation portion 34 terminating in a bulb 36. Portion 34 is made sufficiently long to encourage nucleation and the formation of a single crystal from the many nucleation points which conventionally begin in the bulbous portion 36. The growth tube is then evacuated to approximately $10^{-6}$ Torr, refilled with pure helium to a pressure of 250 Torr, sealed, and attached to a long fused silica rod 38.

Tube 32 and its contained charge material is then placed within a two part furnace 40 which comprises a first part 42 and a second part 44. Part 42 is utilized for growth of the single crystal while part 44 is used to anneal the crystal. Upper furnace part 42 is provided with a temperature profile 46 having an isothermal temperature portion 48 and a steep decreasing temperature gradient 50. Temperature profile 46 is extended to connect with a temperature portion 52 in the connecting zone between furnace parts 42 and 44 and portion 52 is maintained at a constant temperature. Isothermal temperature portion 48 of profile 46 is maintained several hundred degrees centigrade above connecting temperature portion 52 in order to obtain the steep temperature gradient. Gradient 50 is designed to be quite sharp, exceeding 100°C per inch at the melting point of the crystal which occurs, for example, at point 51 of gradient 50. When taken in conjunction with elongated tube portion 34, the steepness of gradient 50 assures slow growth conditions in tube 32 before the solid-liquid interface of the crystal leaves the narrow portion of tube 32. Part 44 is provided with a temperature profile 54 which is preferably slightly above the temperature of portion 52 and which is at a temperature sufficient to anneal the single crystal. The furnace parts are connected by a fused silica tube 56 which is closed off at one end 58 by a cap 60 in order to prevent drafts within the growth furnace caused by convection.

Tube 32 and its enclosed charge material 33 is then suspended by rod 38 within furnace part 42 and within isothermal temperature portion 48. Tube 32 may be rotated at approximately 1.5 revolutions per minute but is not lowered at this temperature for a period of time sufficient to obtain both liquification of the charge material and uniform distribution thereof within the tube. Rotation by means of rod 38 enhances the homogeneous radial distribution and the uniform temperatures of the melt thus formed. Thereafter, tube 32 is slowly lowered at approximately 1.5-2 millimeters per hour. As bulbous portion 36 enters decreasing temperature gradient 50, the temperature of the material therein decreases until nucleation commences usually at several sites. Further lowering causes the nucleation to travel into narrow portion 34 wherein preferably all but one nucleation point is terminated. Tube 32 is further lowered through temperature portion 52 and into temperature portion 54 within furnace part 44 wherein lowering stops. A temperature controller associated with furnace 44 lowers the furnace temperature slowly at approximately 5°C per hour to room temperature in order to anneal the crystal.

Thereafter, tube 32 is removed from furnace 40 and the single crystal is removed from the tube without the use of any mechanical pressure. For this purpose, the growth tube may be dissolved in hydrofluoric acid.

As a step alternate to that disclosed in enclosure 12 of FIG. 1, for materials having low vapor pressures, the VB constituent is purified by baking it in a stream of hydrogen above its melting point and thereafter removed and placed into reaction tube 26 for reaction with the other constituents.

If desired, rather than break and discard reaction tube 26, this tube may be also utilized as growth tube 32 after purification of the VB element has taken place.

EXAMPLE

A single crystal of proustite, $Ag_3AsS_3$, was prepared by the above process. All constituents, arsenic, silver and sulfur, were of 99.9999% purity. For each 100 grams of proustite, 15.2 grams of arsenic were placed in sublimation chamber 24. In reaction chamber 26 was placed 65.4 grams of silver and 19.4 grams of sulfur plus an additional 3 grams excess of sulfur. Tube 22 was evacuated to approximately $10^{-6}$ Torr and sealed. The arsenic contained in sublimation chamber 24 was then placed within a clamshell furnace such as furnace 29 and heated to approximately 600°C. The arsenic vaporized and moved over to the reaction chamber through a 2 millimeter diameter neck, such as neck 27. Thereafter, the furnace was cooled and the tube removed and sealed off at the neck portion. A residue was observed in chamber 24 and identified as suboxides of arsenic.

After neck portion 27 was sealed off by a blow torch, the reaction tube was heated uniformly in a clamshell furnace to approximately 800°C and left in this condition for approximately one-half hour. Thereafter, the furnace was shut off and the tube was permitted to uniformly cool to room temperature. The proustite charge material thus formed was then removed from tube 26 by cracking the tube and a portion of the charge material was ground in an alumina mortar and pestle. Some residual sulfur was observed to remain on the walls of the cracked reaction tube. The ground charge material was placed in bulb 36 and tube portion 34, the remaining material being placed thereabove in the growth tube. The tube was then evacuated to approximately $10^{-6}$ Torr, back filled with 250 Torr pure helium, sealed, and attached to a long fused silica rod.

The tube with the charge material was then placed within the upper portion of a furnace such as that shown in FIG. 4 and rotated at 1.5 revolutions per minute. The charge material was heated above its melting point (480°C) to approximately 750°C. After the melt was formed, lowering was commenced through the isothermal temperature portion and into the decreasing temperature gradient at a rate of 1.8 millimeters per hour. The gradient was at 150°C per inch. The tube was further lowered into the region connecting the two furnaces 42 and 44 where there existed a constant temperature of approximately 100°C, identified by portion 52 of FIG. 4. Annealing in the bottom furnace was approximately at a temperature of 250°C. Lowering was stopped and the temperature in furnace part 44 was slowly lowered at approximately 5°C per hour to room temperature.

Thereafter, the fused silica growth tube 32 was dissolved in hydrofluoric acid to remove the single crystal. The resulting single crystal was of very high optical quality with no strain or strain cracking therein.

Other materials grown by the herein disclosed method are shown in tabular form below, along with the results given above for proustite.

| Ternary Chalcogenide | Purification Temperature | Reaction Temperature | Isothermal Temperature | Temperature Gradient | Anneal Temperature |
|---|---|---|---|---|---|
| $Ag_3AsS_3$ | 600°C* | 700–800°C | 750°C | 150°C/in. | 250°C |
| $Ag_3SbS_3$ | 650°C** | 700–800°C | 750°C | 150°C/in. | 250°C |
| $Ag_7AsS_6$ | 600°C* | 400–450°C | 425°C | 150°C/in. | 250°C |
| $Ag_7SbS_6$ | 650°C** | 400–450°C | 425°C | 150°C/in. | 250°C |
| $Ag_7AsSe_6$ | 600°C* | 500–550°C | 525°C | 150°C/in. | 250°C |
| $Ag_7SbSe_6$ | 650°C** | 600–650°C | 625°C | 150°C/in. | 250°C |
| $AgSbSe_2$ | 650°C** | 600–650°C | 625°C | 150°C/in. | 250°C |
| $Tl_3AsS_3$ | 600°C* | 400–450°C | 425°C | 150°C/in. | 225°C |

*At $10^{-6}$ Torr atmosphere
**In a dynamic hydrogen atmosphere (flowing hydrogen)

Although the invention has been described with reference to particular embodiments thereof, it should be realized that various changes and modifications may be made therein without departing from the spirit and scope of the invention.

What is claimed is:

1. A method for synthesizing a single crystal selected from the ternary chalcogenides consisting of the IB-As-VIB and Tl-As-VIB Groups of the Periodic Table of Elements, where the IB elements consist of copper and silver and where the VIB elements consist of sulfur, selenium and tellurium, said ternary chalcogenides having a single stable solid phase between room temperature and their melting points, comprising the steps of:

utilizing a purification tube of fused silica having a reaction chamber, a sublimation chamber, and an open neck portion connecting the chambers, placing stoichiometric quantities of the arsenic constituent of the crystal in the sublimation chamber and the remaining consitutents of the crystal in the reaction chamber and placing an approximate additional 3% quantity of the VIB constituent in excess of stoichiometry in the reaction chamber, evacuating the purification tube to approximately $10^{-6}$ Torr and sealing the purification tube, placing the sublimation chamber and its contained arsenic constituent in a furnace while leaving the reaction chamber and its contained constituents outside the furnace, heating the sublimation chamber and its arsenic constituent sufficient for permitting substantially complete vaporization and movement of the resulting arsenic vapors into the reaction chamber through the open neck portion, cooling the purification tube and sealing off the reaction chamber at the neck portion, placing the sealed reaction chamber in a furnace and uniformly heating the crystal constituents contained in the reaction chamber to at least the reaction temperature of the contained crystal contituents for a time sufficient for obtaining full reaction of the contained crystal constituents, cooling the reacted crystal constituents uniformly, breaking the reaction chamber and removing the crystal material therefrom, grinding the crystal material, placing the ground crystal material in a fused silica crystal growth tube having an elongated nucleation neck portion at one end thereof, evacuating the growth tube to approximately $10^{-6}$ Torr, backfilling the growth tube with approximately 250 Torr pure helium, and sealing the growth tube, placing the sealed growth tube and its contained crystal material in a furnace apparatus comprising two furnace parts having a separation therebetween, the first furnace part having a temperature profile comprising an isothermal temperature portion and a decreasing temperature gradient of at least 100°C per inch and the second furnace part having an isothermal temperature profile at a temperature above the lowest temperature of the decreasing temperature gradient, heating the crystal material in the first furnace part within the isothermal temperature portion thereof to a temperature substantially above the melting point of the crystal material for forming a melt therefrom, lowering and rotating the growth tube and its contained crystal material melt from the first furnace isothermal temperature portion and through the decreasing temperature gradient at approximately 1.8 millimeters per hour for nucleating and growing the single crystal, further lowering the growth tube and its contained single crystal into the second furnace part within the isothermal temperature profile thereof and stopping movement therein for a time sufficient for annealing the single crystal, cooling the second furnace part, the growth tube and the annealed crystal at a rate of approximately 5°C per hour to room temperature, and dissolving the growth tube in hydrofluoric acid without applying mechanical pressure to the crystal for removing the single crystal.

2. A method as in claim 1 wherein the neck portion of the fused silica purification tube has an approximate 2 mm opening means between the sublimation and reaction chambers.

3. A method as in claim 1 wherein the first furnace part isothermal temperature portion has a temperature at least 50°C above the melting point of the crystal material.

4. A method for synthesizing a single crystal of optical quality selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

purifying the VB crystal constituent of anion impurities, maintaining the purity of the purified VB constituent from the anion impurities while reacting substantially stoichiometric quantities of the purified VB constituent and the remaining crystal constituents with additional VIB constituent in excess of stoichiometry sufficient for producing a polycrystalline form of the crystal and for subsequently forming a single crystal of optical quality therefrom, melting the polycrystalline form into a homogeneous melt in a suitable atmosphere, and progressively solidifying portions of the melt into a temperature zone below the melting point thereof and at a rate sufficient for forming the single crystal.

5. A method as in claim 4 wherein said purifying step comprises the steps of:

utilizing a purification tube, placing the VB constituent comprising arsenic in a first portion of the tube and the remaining crystal constituents in a second portion of the tube, evacuating the tube, and vaporizing the arsenic constituent in the first portion and condensing the arsenic constituent vapor in the second portion of the tube, thereby for leaving any of the anion impurities substantially in the first portion.

6. A method as in claim 5 wherein the purification tube includes an open neck portion having a passageway therein connecting the first and second portions, the passageway having opening means sufficient for permitting movement of the arsenic vapor therethrough but for impeding movement of solids therethrough.

7. A method as in claim 5 wherein said purification step is performed at an evacuated pressure of approximately $10^{-6}$ Torr.

8. A method as in claim 5 further including the steps of heating the first portion the tube while maintaining the second portion of the tube cooler than the first portion for effecting respectively said vaporizing and condensing steps.

9. A method as in claim 5 further comprising the step of:

sealing and separating the second portion from the first portion of the tube; and wherein said reacting step includes the step of:

heating the sealed second portion and the crystal constituents contained therein to at least the reaction temperature of the crystal constituents for a time sufficient for fully reacting the crystal constituents.

10. A method for synthesizing a single crystal selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

purifying the VB crystal constituent of anion impurities;

maintaining the purity of the purified VB constituent from the anion impurities while reacting substantially stoichiometric quantities of the purified VB constituent and the remaining crystal constituents sufficient for producing a polycrystalline form of the crystal;

melting the polycrystalline form of the crystal into a homogeneous melt in a suitable atmosphere; and lowering the melt through a decreasing temperature gradient of at least approximately 4°C/mm at a rate of $1.75 \pm 0.25$ mm/hour for forming the single crystal.

11. A method as in claim 10 wherein the suitable atmosphere comprises pure helium at 250 Torr.

12. A method as in claim 10 further including the step of annealing the single crystal.

13. A method for synthesizing a single crystal of optical quality of the compound having the chemical formula $Ag_3AsS_3$ from arsenic, silver and sulfur constituents comprising the steps of:

heating the arsenic constituent to a temperature of approximately 600°C within a closed environment sealed from the atmosphere ambient to the closed environment and evacuated to approximately $10^{-6}$ Torr, for purifying the arsenic constituent of anion impurities, while avoiding premature mixture of the arsenic constituent with the remaining constituents, maintaining the purity of the purified arsenic constituent while mixing in substantially stoichiometric quantities of the purified arsenic constituent, the silver constituent, and the sulfur constituent, with additional sulfur in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, thereby for forming mixed constituents, reacting all the mixed constituents in the closed reaction tube at a temperature of approximately 800°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 750°C for forming a melt from the compound and by lowering the envelope and the melt through a decreasing temperature gradient of at least 100°C/inch at 1.75 ± 0.25 mm/hour, and annealing the single crystal at a temperature and for a time sufficient for said annealing.

14. A method for synthesizing a single crystal of optical quality of the compound having the chemical formula $Ag_3SbS_3$ from antimony, silver and sulfur constituents comprising the steps of:

heating the antimony constituent to a temperature of approximately 650°C in a dynamic hydrogen atmosphere environment closed from the atmosphere ambient to the closed environment for purifying the antimony constituent of anion impurities, while avoiding premature mixture of the antimony constituent with the remaining constituents, maintaining the purity of the purified antimony constituent while mixing in substantially stoichiometric quantities of the purified antimony constituent, the silver constituent, and the sulfur constituent, with additional sulfur in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, thereby for forming mixed constituents, reacting all the mixed constituents in the closed reaction tube at a temperature of approximately 800°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 750°C for forming a melt from the compound and by lowering the envelope and the melt through a decreasing temperature gradient of at least 100°C/inch at 1.75 ± 0.25 mm/hour, and annealing the single crystal at a temperature and for a time sufficient for effecting said annealing.

15. A method for synthesizing a single crystal of optical quality of the compound having the chemical formula $Ag_7AsS_6$ from silver, arsenic and sulfur constituents comprising the steps of:

heating the arsenic constituent to a temperature of approximately 600°C within a closed environment sealed from the atmosphere ambient to the closed environment and evacuated to approximately $10^{-6}$ Torr, for purifying the arsenic constituent of anion impurities while avoiding premature mixture of the arsenic constituent with the remaining constituents, maintaining the purity of the purified arsenic constituent while mixing in substantially stoichiometric quantities of the purified arsenic constituent, the silver constituent, and the sulfur constituent, with additional sulfur in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 425°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 450°C for forming a melt from the compound and by lowering the envelope and the melt through a decreasing gradient of at least 100°C/inch at 1.75 ± 0.25 mm/hour, and annealing the single crystal at a temperature and for a time sufficient for effecting said annealing.

16. A method for synthesizing a single crystal of optical quality of the compound having the chemical formula $Ag_7SbS_6$ from silver, antimony and sulfur constituents comprising the steps of:

heating the antimony constituent to a temperature of approximately 650°C in a dynamic hydrogen atmosphere environment closed from the atmosphere ambient to the closed environment for purifying the antimony constituent of anion impurities while avoiding premature mixture of the antimony constituent with the remaining constituents, maintaining the purity of the purified antimony constituent while mixing in substantially stoichiometric quantities of the purified antimony constituent, the silver constituent, and the sulfur constituent, with additional sulfur in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 425°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 450°C for forming a melt from the compound and by lowering the envelope and the melt through a decreasing temperature gradient of at least 100°C/inch at 1.75 ± 0.25 mm/hour, and annealing the single crystal at a temperature and for a time sufficient for effecting said annealing.

17. A method for synthesizing a single crystal of optical quality of the compound having the chemical formula $Ag_7AsSe_6$ from silver, arsenic and selenium constituents comprising the steps of:

heating the arsenic constituent to a temperature of approximately 600°C in a closed environment sealed from the atmosphere ambient to the closed environment and evacuated to approximately $10^{-6}$ Torr, for purifying the arsenic constituent of anion impurities while avoiding premature mixture of the arsenic constituent with the remaining constituents, maintaining the purity of the purified arsenic constituent while mixing in substantially stoichiometric quantities of the purified arsenic constituent, the silver constituent, and the selenium constituent, with additional selenium in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 550°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 525°C for forming a melt from the compound and by lowering the envelope and the melt through a decreasing temperature gradient of at least 100°C/inch at 1.75 ± 0.25 mm/hour, and annealing the single crystal at a temperature and for a time sufficient for effecting said annealing.

18. A method for synthesizing a single crystal of optical quality of the compound having the chemical formula $Ag_7SbSe_6$ from silver, antimony and selenium constituents comprising the steps of:

heating the antimony constituent to a temperature of approximately 650°C in a dynamic hydrogen atmosphere environment closed from the atmosphere ambient to the closed environment for purifying the antimony constituent of anion impurities while avoiding premature mixture of the antimony constituent with the remaining constituents, maintaining the purity of the purified antimony constituent while mixing in substantially stoichiometric quantities of the purified antimony constituent, the silver constituent, and the selenium constituent, with additional selenium in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 650°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 625°C for forming a melt from the compound and melt through a decreasing temperature gradient of at least 100°C/inch at 1.75 ± 0.25 mm/hour, and annealing the single crystal at a temperature and for a time sufficient for effecting said annealing.

19. A method for synthesizing a single crystal of optical quality of the compound having the chemical formula $AgSbSe_2$ from silver, antimony and selenium constituents comprising the steps of:

heating the antimony constituent to a temperature of approximately 650°C in a dynamic hydrogen atmosphere environment closed from the atmosphere ambient to the closed environment for purifying the antimony constituent of anion impurities while avoiding premature mixture of the antimony constituent with the remaining constituents, maintaining the purity of the purified antimony constituent while mixing in substantially stoichiometric quantities of the purified antimony constituent, the silver constituent, and the selenium constituent, with additional selenium in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 650°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 625°C for forming a melt from the compound and by lowering the envelope and the melt through a decreasing temperature gradient of at least 100°C/inch at 1.75 ± 0.25 mm/hour, and annealing the single crystal at a temperature and for a time sufficient for effecting said annealing.

20. A method for synthesizing a single crystal of optical quality of the compound having the chemical formula $Tl_3AsS_3$ from thallium, arsenic and sulfur constituents comprising the steps of:

heating the arsenic constituent to a temperature of approximately 600°C in a closed environment sealed from the atmosphere ambient to the closed environment and evacuated to approximately $10^{-6}$ Torr, for purifying the arsenic constituent of anion impurities while avoiding premature mixture of the arsenic constituent with the remaining constituents, maintaining the purity of the purified arsenic constituent while mixing in substantially stoichiometric quantities of the purified arsenic constituent, the thallium constituent, and the sulfur constituent, with additional sulfur in excess of stoichiometry sufficient for ensuring subsequent formation of the compound and growth of a single crystal of optical quality therefrom, in a closed reaction tube sealed from the atmosphere ambient to the closed reaction tube for maintaining the constituents free from anion impurities, for thus forming mixed constituents, reacting all the mixed constituents in the closed reaction tube at a temperature of approximately 400°C for forming the compound, placing the compound in an envelope, evacuating the envelope to approximately $10^{-6}$ Torr, backfilling the envelope with approximately 250 Torr of substantially pure helium and sealing the envelope, growing a single crystal of the compound in the envelope by heating the compound to a temperature of approximately 425°C for forming a melt from the compound and by lowering the envelope and the melt through a decreasing temperature gradient of at least 100°C/inch at 1.75 ± 0.25 mm/hour, and annealing the single crystal at a temperature and for a time sufficient for effecting said annealing.

21. A method for synthesizing a single crystal of optical quality selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

purifying the VB crystal constituent of anion impurities;

maintaining the purity of the purified VB constituent from the anion impurities while reacting substantially stoichiometric quantities of the purified VB constituent and the remaining crystal constituents with approximately 3% in excess of the VIB constituent sufficient for producing a polycrystalline form of the crystal;

melting the polycrystalline form into a homogeneous melt in a suitable atmosphere; and progressively solidifying portions of the melt into a temperature zone below the melting point thereof and at a rate sufficient for forming a single crystal.

22. A method for synthesizing a single crystal of optical quality selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

purifying the VB crystal constituent of anion impurities while baking the VB constituent in a dynamic hydrogen atmosphere;

maintaining the purity of the purified VB constituent from the anion impurities while reacting substantially stoichiometric quantities of the purified VB constituent and the remaining crystal constituents with additional VIB constituent in excess of stoichiometry sufficient for producing a polycrystalline form of the crystal and for subsequently forming a single crystal of optical quality therefrom;

melting the polycrystalline form into a homogeneous melt in a suitable atmosphere; and progressively solidifying portions of the melt into a decreasing temperature zone below the melting point thereof and at a rate sufficient for forming the single crystal.

23. A method for synthesizing a single crystal of optical quality selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

utilizing a purification tube of fused silica having a reaction chamber, a sublimation chamber, and an open neck portion connecting the chambers;

placing substantially stoichiometric quantities of the VB constituent of the crystal comprising arsenic in the sublimation chamber and the remaining constituents of the crystal in the reaction chamber and placing an approximate additional 3% quantity of the VIB constituent in excess of stoichiometry in the reaction chamber;

evacuating the purification tube to approximately $10^{-6}$ Torr and sealing the purification tube;

placing the sublimation chamber and its contained arsenic constituent in a furnace while leaving at least a major portion of the reaction chamber and its contained constituents outside the furnace;

heating the sublimation chamber and its arsenic constituent sufficient for substantially completely vaporizing and moving the resulting arsenic vapors into the reaction chamber through the open neck portion and for condensing of the arsenic vapors in the reaction chamber, and thereby for purifying the VB crystal constituent of anion impurities;

cooling the purification tube and sealing off the reaction chamber at the neck portion;

maintaining the purity of the purified VB constituent from the anion impurities while reacting substantially stoiciometric quantities of the purified VB constituent and the remaining crystal constituents sufficient for producing a polycrystalline form of the crystal;

melting the polycrystalline form into a homogeneous melt in a suitable atmosphere; and progressively solidifying portions of the melt into a temperature zone below the melting point thereof and at a rate sufficient for forming a single crystal.

24. A method as in claim 23 wherein the opening means is 1.5±0.5 mm.

25. A method for synthesizing a single crystal of optical quality selected from the ternary chalcogenides consisting of the IB-VB-VIB and IIIB-VB-VIB Groups of the Periodic Table of Elements, where the IB elements consist of copper and silver, the VIB elements consist of sulfur, selenium and tellurium and the IIIB element consists of thallium, said compounds having a single stable solid phase between room temperature and their melting points, comprising the steps of:

purifying the VB crystal constituent of anion impurities;

maintaining the purity of the purified VB constituent from the anion impurities while reacting substantially stoichiometric quantities of the purified VB constituent and the remaining crystal constituents with additional VIB constituent in excess of stoichiometry sufficient for producing a polycrystalline form of the crystal and for subsequently forming a single crystal of optical quality therefrom;

placing the polycrystalline form of the crystal in a fused silica crystal growth tube having an elongated nucleation neck portion at one end thereof;

evacuating the growth tube to approximately $10^{-6}$ Torr, backfilling the growth tube with approximately 250 Torr of substantially pure helium, and sealing the growth tube;

placing the sealed growth tube and the contained polycrystalline form in a furnace apparatus comprising two furnace parts having a separation therebetween, the first part having a temperature profile comprising an isothermal temperature portion and a decreasing temperature gradient of at least 100°C per inch and the second furnace part having an isothermal temperature profile at a temperature above the lowest temperature of the decreasing temperature gradient;

heating the polycrystalline form in the first furnace part within the isothermal temperature portion thereof to a temperature substantially above the melting point of the polycrystalline form for forming a melt therefrom;

lowering the growth tube and its contained melt from the first furnace isothermal temperature portion and through the decreasing temperature gradient at approximately 1.75 ± 0.25 millimeters per hour for nucleating and growing the single crystal;

further lowering the growth tube and its contained single crystal into the second furnace part and within the isothermal temperature profile thereof and stopping movement therein for a time sufficient for annealing the single crystal;

cooling the second furnace part, the growth tube and the annealed crystal at a rate ranging from 2.5° to 5.0°C per hour to room temperature; and removing the single crystal from the growth tube.

* * * * *